(12) United States Patent
Wang et al.

(10) Patent No.: US 6,573,156 B1
(45) Date of Patent: Jun. 3, 2003

(54) LOW DEFECT METHOD FOR DIE SINGULATION AND FOR STRUCTURAL SUPPORT FOR HANDLING THIN FILM DEVICES

(75) Inventors: David Xuan-Qi Wang, San Diego, CA (US); Jason Yao, San Diego, CA (US)

(73) Assignee: OMM, Inc., San Diego, CA (US)

( * ) Notice: Subject to any disclaimer, the term of this patent is extended or adjusted under 35 U.S.C. 154(b) by 0 days.

(21) Appl. No.: 10/020,050

(22) Filed: Dec. 13, 2001

(51) Int. Cl.$^7$ .............................................. H01L 21/46
(52) U.S. Cl. ...................... 438/460; 438/461; 438/462; 438/463; 438/464
(58) Field of Search ........................... 438/13, 460–464

(56) References Cited

U.S. PATENT DOCUMENTS

| | | |
|---|---|---|
| 5,904,546 A | 5/1999 | Wood et al. |
| 6,048,777 A | 4/2000 | Choudhury et al. |
| 6,107,164 A | 8/2000 | Ohuchi et al. |
| 6,117,347 A * | 9/2000 | Ishida .......................... 216/17 |
| 6,200,882 B1 | 4/2001 | Drake et al. |
| 6,277,666 B1 | 8/2001 | Hays et al. |

FOREIGN PATENT DOCUMENTS

| | | |
|---|---|---|
| EP | 0182218 A2 | 5/1986 |
| EP | 0182218 B1 | 6/1991 |
| EP | 00499752A A2 | 8/1992 |
| EP | 0551616 B1 | 12/1992 |
| EP | 0551616 A1 | 12/1992 |
| EP | 00550014A A2 | 7/1993 |
| EP | 00603514A A2 | 6/1994 |
| EP | 01026725A A2 | 8/2000 |
| EP | 01093169A A1 | 4/2001 |
| EP | 01130629A A1 | 9/2001 |
| WO | WO 01/56063 A2 | 8/2001 |

OTHER PUBLICATIONS

Schindling, English Abstract, Patent No. 00551616 EP B1, patent application No. 92121062, Dated Filed Dec. 10, 1996.

* cited by examiner

*Primary Examiner*—David Nelms
*Assistant Examiner*—Dung Anh Le
(74) *Attorney, Agent, or Firm*—Arien Ferrell Aagaard & Balzan, LLP (57) ABSTRACT

In certain implementations, a method for chip singulation is provided including etching a frontside dicing trench from a front side of a wafer, forming a temporary holding material, in the frontside dicing trench, etching a backside dicing trench from a back side of the wafer along the frontside dicing trench, removing the temporary holding material and releasing the chip from the wafer or an adjacent chip. Certain implementations may include etching through surface deposited layers on the front side of the wafer. Certain implementations may further include completely filling the frontside dicing trench with the temporary holding material and etching the backside dicing trench to the temporary holding material that is in the frontside dicing trench, such that removing the temporary holding material self-dices the wafer. Certain implementations may include surrounding MEMS structures with the temporary holding material so as to hold the structures during etching of the back side of the wafer. Some implementations may include providing a carrier wafer over the front side of the wafer. In certain implementations, the temporary holding material may be parylene, deposited by vapor deposition. In such implementations, the parylene may be removed by dry etching with an oxide plasma etch.

27 Claims, 8 Drawing Sheets

LOW DEFECT METHOD FOR DIE SINGULATION AND FOR STRUCTURAL SUPPORT FOR HANDLING THIN FILM DEVICES

BACKGROUND

Microelectromechanical systems (MEMS), which are made up of several micromachined electrical-mechanical structures, have a size typically on a millimeter scale or smaller. These micromachined structures are used to produce MEMS devices that are used in a wide variety of applications including, for example, sensing, electrical and optical switching, and micromachinery (such as robotics and motors). MEMS devices utilize both the mechanical and electrical attributes of a material to achieve desired results. Because of their small size, MEMS devices may be fabricated using semiconductor processing methods and other microfabrication techniques, such as thin-film processing and photolithography.

In a typical MEMS process, MEMS devices are fabricated by thin film processes on a wafer. The wafer is then diced to separate the MEMS devices from each other such as by sawing, scoring, cutting, grinding, or other similar separation technique. A drawback of traditional dicing tools is that they can damage the devices. This is particularly true when MEMS devices are involved. MEMS devices sometimes can contain delicate structures that are sensitive to shock, vibration, and jarring.

Moreover, debris contamination often caused by traditional mechanical dicing tools is of particular concern in MEMS applications. This is because debris can become lodged between structures, inhibiting movement of and/or causing shorting between the structures, thus rendering the MEMS device inoperable. In some MEMS applications, several tens to several hundreds or more of MEMS devices may be on a single chip. Malfunction of a single device can cause the entire chip to be unusable.

In addition, traditional separation techniques can be time consuming, constraining manufacturing throughout. This is particularly true in very large chip arrays of hundreds, to thousands, or more.

Futhermore, in practicality, traditional dicing techniques limit separation of the chips into square or rectangular shaped chips. This limitation is something that may not be advantageous in all MEMS applications.

What is needed is an improved method for chip separation that provides improved yields and device reliability. Moreover, what is needed is an improved method for separation of MEMS chips having delicate structures. In Addition, what is needed is a less time consuming method for chip singulation. Further, what is needed is an improved method, allowing cost effective, high yield separation of non-traditional shaped chips.

SUMMARY

In certain implementations, a method for chip singulation is provided including etching a frontside dicing trench from a front side of a wafer, forming a temporary holding material in the frontside dicing trench, etching a backside dicing trench from a back side of the wafer along the frontside dicing trench, removing the temporary holding material and releasing the chip from the wafer and/or an adjacent chip.

In some implementations, the method includes etching through surface deposited layers on the front side of the wafer. The method may further include completely filling the frontside dicing trench with the temporary holding material and etching the backside dicing trench to the temporary holding material that is in the frontside dicing trench, such that removing the temporary holding material self-dices the wafer.

In certain implementations, the method includes surrounding MEMS structures with the temporary holding material so as to hold the structures during etching of the back side of the wafer. This method may include providing a carrier wafer over the front side of the wafer.

In certain implementations, the temporary holding material may be parylene, deposited by vapor deposition. In such implementations, the parylene may be removed by dry etching, such as by an oxide plasma etch.

DESCRIPTION

Figure 1:
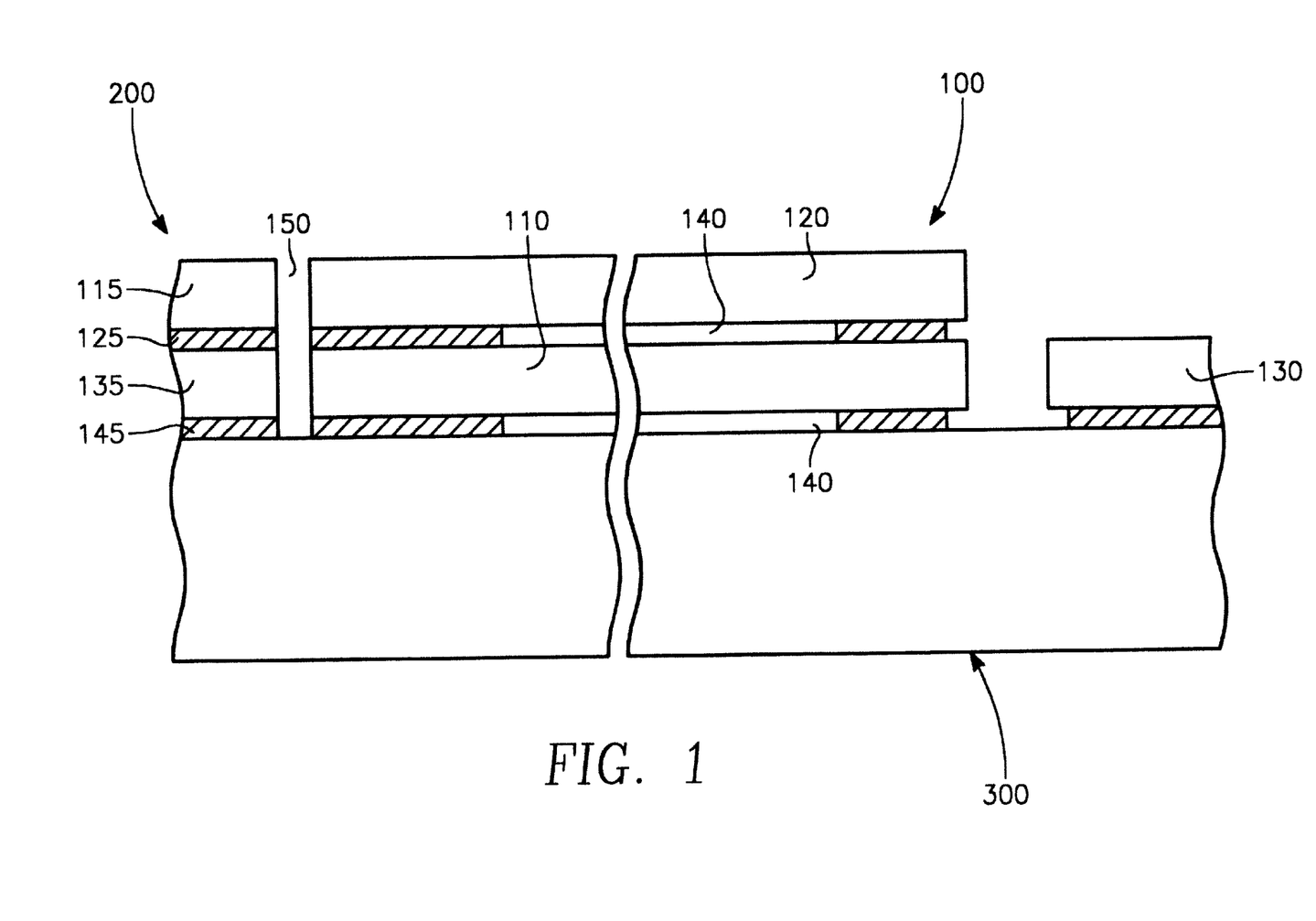
FIG. 1 shows a cut away side view of a front side etched workpiece in accordance with a possible implementation of the present invention.

FIG. 1 illustrates a cross section of portions of two MEMS devices 100 and 200 on a wafer substrate 300, such as a silicon or other substrate. FIG. 1 shows MEMS device 100 having MEMS structures 110, 120, and 130 defined from layers 115, 125, 135, and 145 by etching. In the illustration of FIG. 1, high profile elongated structures 110 and 120 with adjacent gaps 140 are shown for example purposes. The MEMS device 100 may have other fragile and/or confined structures (not shown), such as comb drives, or other delicate and/or densely packed structures.

Along with defining the structures 110, 120, and 130, a frontside dicing trench 150 is etched from the layers 115, 125, 135, and 145. The frontside dicing trench 150 may be etched with several different etch steps corresponding to the different layers 115, 125, 135, or 145, or with a single etch step, depending on the materials and etch chemistries involved. The frontside etch trench 150 may be formed at the same time as one or more of the structures 110, 120, or 130, or after completion of defining the structures 110, 120, and 130.

Although the frontside dicing trench is shown etched all the way to the wafer substrate 300, in other implementations, it is possible to etch less than all the way to the wafer substrate 300

Figure 2:
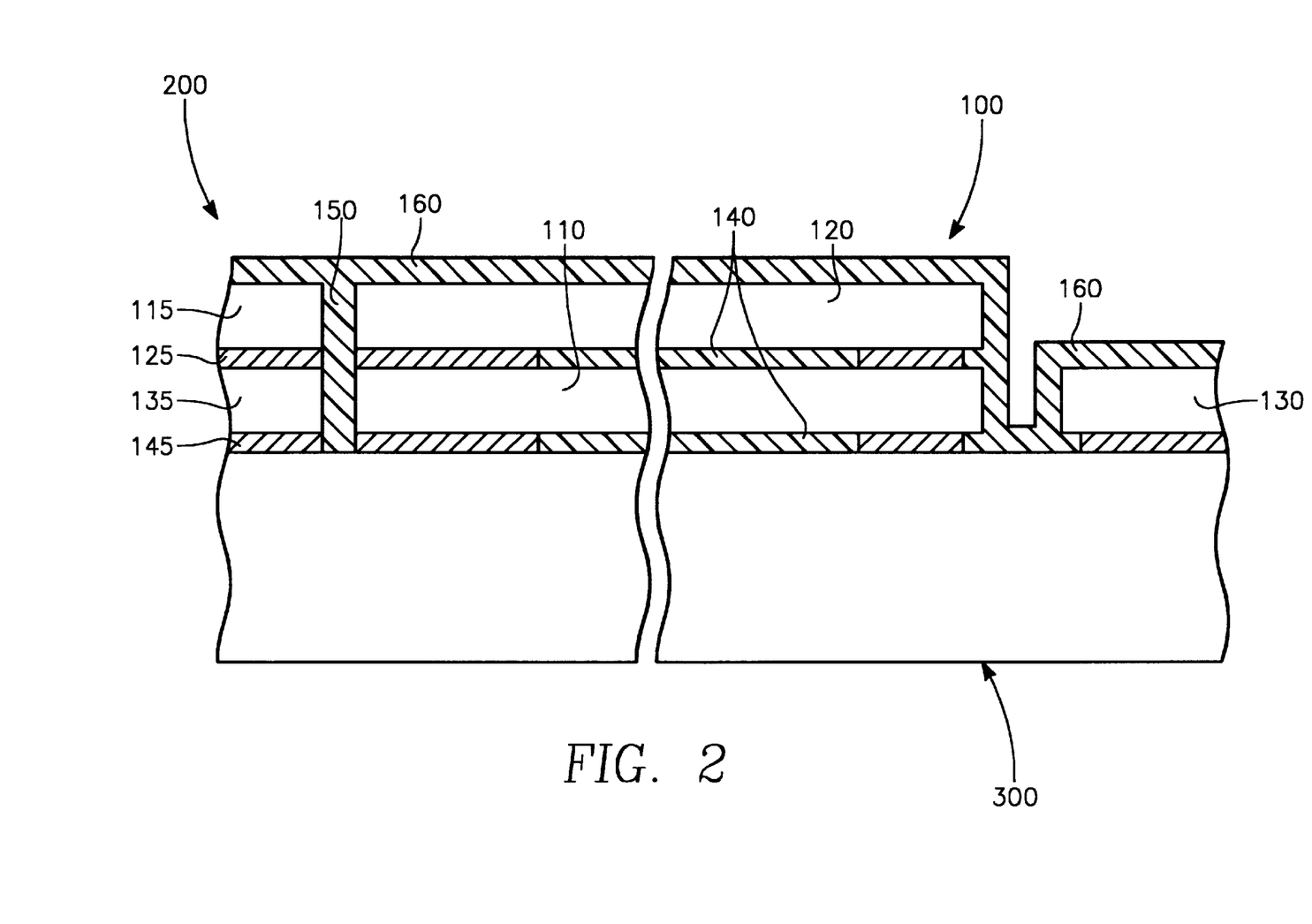
FIG. 2 shows a cut away side view of the workpiece of FIG. 1 having temporary holding material deposited thereon in accordance with a possible implementation of the present invention.

Turning to FIG. 2, a temporary holding material 160 is deposited in the frontside dicing trench prior to backside processing. The temporary holding material can be selectively deposited, or allowed to deposit on all of the structures 110, 120, and 130 as shown in FIG. 2. The temporary holding material 160 may be a conformal material which deposits into the gaps 140 between and around the structures of the MEMS devices 100 and 200 (including any movable, fragile, and densely packed structures) Thus, in the implementation of FIG. 2, the temporary holding material 160 completely fills the frontside dicing trench 150 and the gaps 140, although this is not necessary in all implementations. In this example, the temporary holding material 160 can, in part, protect structures and surfaces of the MEMS devices 100 and 200 during backside processing. As such, while the wafer 300 is inverted for backside processing, the temporary holding material 160 serves to hold pieces of the MEMS devices 100 and 200 together and also can provide protection to any exposed parts.

Any type of temporary holding material 160 may be used in this process, such as for example, photoresist, epoxy, or the like. Using spin-on materials, such as photoresist, to form the temporary holding material, however, is not ideal in all situations. Some fragile structures may not survive the spinning operation. Further, with smaller geometries, high viscosity spin-on materials might not be able to fill into deep and narrow trenches continuously. Moreover, pockets of air can inhibit photoresist from completely surrounding the structures. Thus, high viscosity material does not always work well with smaller geometries because it cannot reach each cavity of the MEMS devices 100 and 200. Trapped gas bubbles and thermal expansion mismatches during solvent baking and curing steps could generate significant stress and cause possible damage to the microstructures. Some epoxies may also be used as the temporary holding material 160, but some epoxies can present problems in completely filling small cavities.

In certain implementations the temporary holding material 160 is selected so as to allow dry or vapor phase deposition, and dry phase removal of the temporary holding material 160. This can help avoid surface tension effects and solvents which could otherwise contribute to formation of voids or cause stresses on the structures.

Thus, in certain implementations, vapor phase polymer deposition permits deposition within deep trenches and, if desired, coating of released microstructures to permit further wafer level handling and processing. After wafer level processing is complete, the polymer is removed by dry etching, such as with an oxygen plasma, to release the chips (along with any coated microstructures).

In one implementation, the temporary holding material 160 is parylene. Parylene is an extremely conformal material. Parylene may be deposited from vapor phase into cracks and crevices of the MEMS structure and leaves substantially no voids at the depositing surface. In some implementations, additional parylene may be deposited to form a film over the microstructures to hold and protect the microstructures. For example, about a 15 micron film may be deposited.

Parylene deposition can be performed at room temperature. Thus, solvent baking or curing is not necessary. As a result, a parylene thin film has lower intrinsic stress than spin coated polymers. This can further offer an advantage in supporting and protecting fragile microstructures.

A dry etching method, such as oxygen plasma polymer removal can serve to release miscrosurtures without causing stiction sometimes associated with surface tension forces at air/liquid interfaces during and after releasing with liquid phase etching. Further, dry etching in general has less contamination than liquid phase etching.

Figure 3:
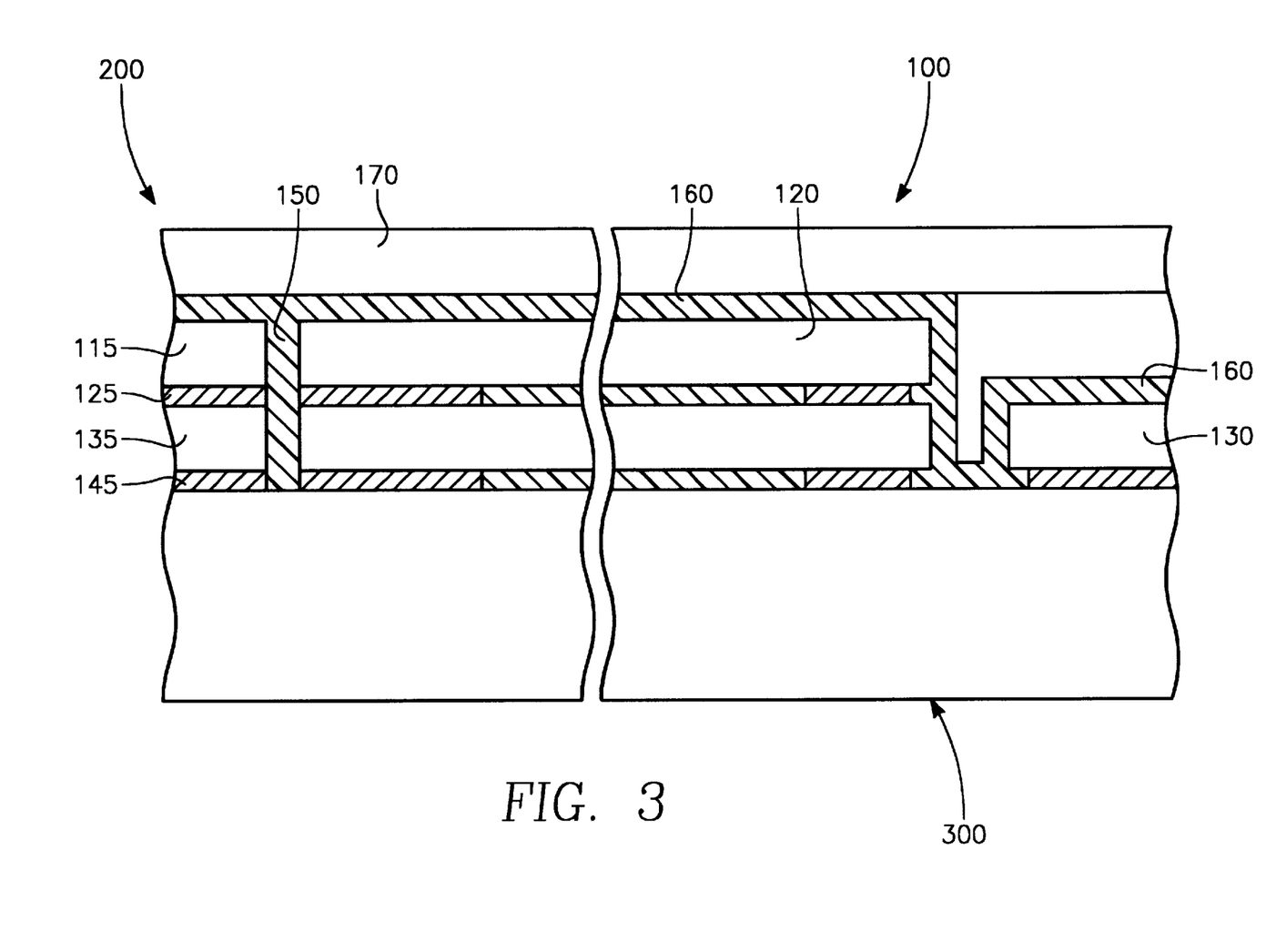
FIG. 3 shows a cut away side view of the workpiece of FIG. 2 having a carrier wafer thereover in accordance with a possible implementation of the present invention.

Turning to FIG. 3, after depositing the temporary holding material 160, an optional carrier wafer 170 is attached to the front side of the wafer 300. The carrier wafer 170 may be applied with a bonding agent, such as resist (not shown). The carrier wafer 170 facilitates handling of the wafer during processing, can assist in holding the MEMS devices 100 and 200 in place, and can provide further protection for the structures of the MEMS devices.

Figure 4:
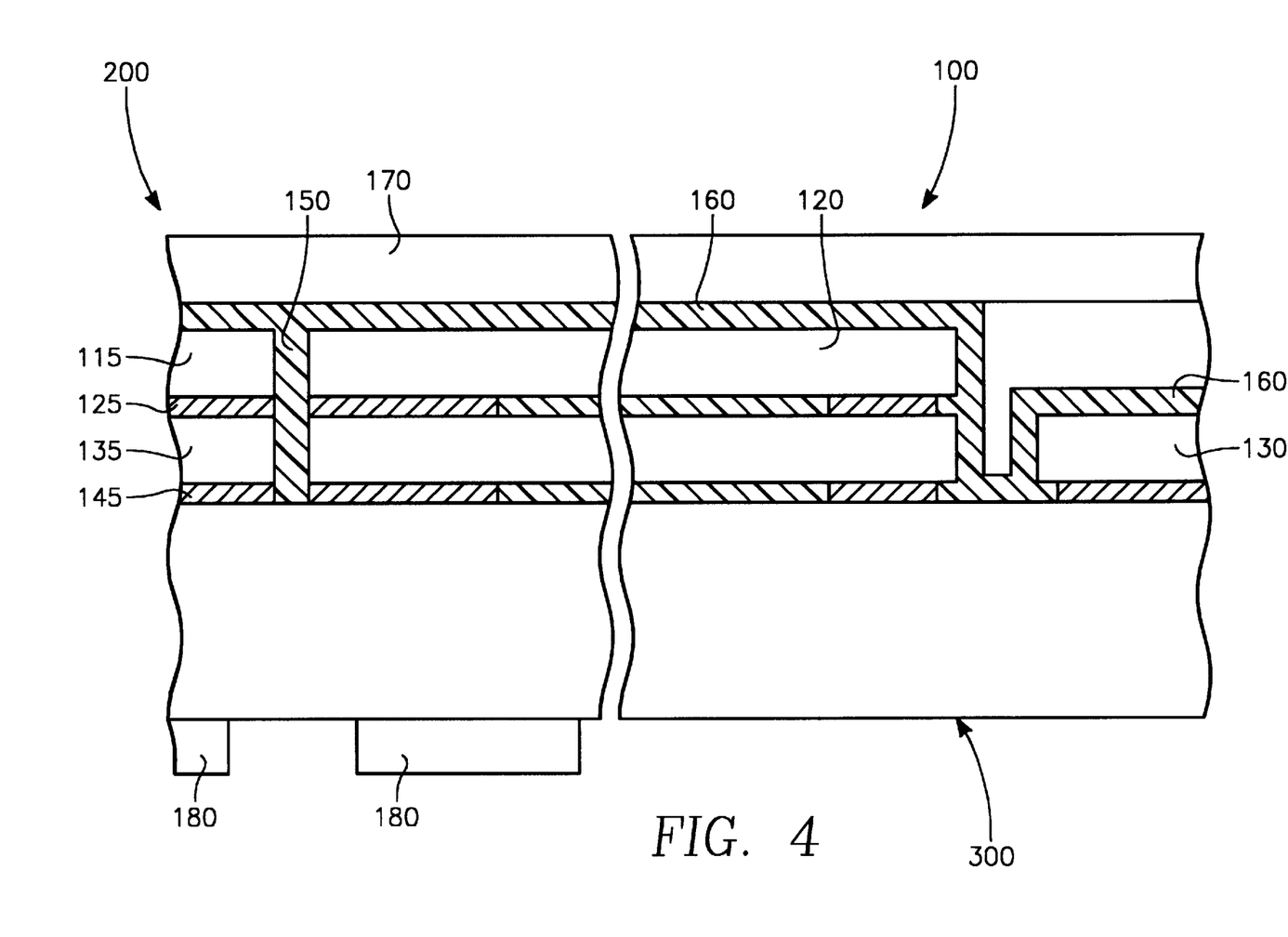
FIG. 4 shows a cut away side view of the workpiece of FIG. 3 having a resist mask on a back side of the workpiece in accordance with a possible implementation of the present invention.
Figure 5:
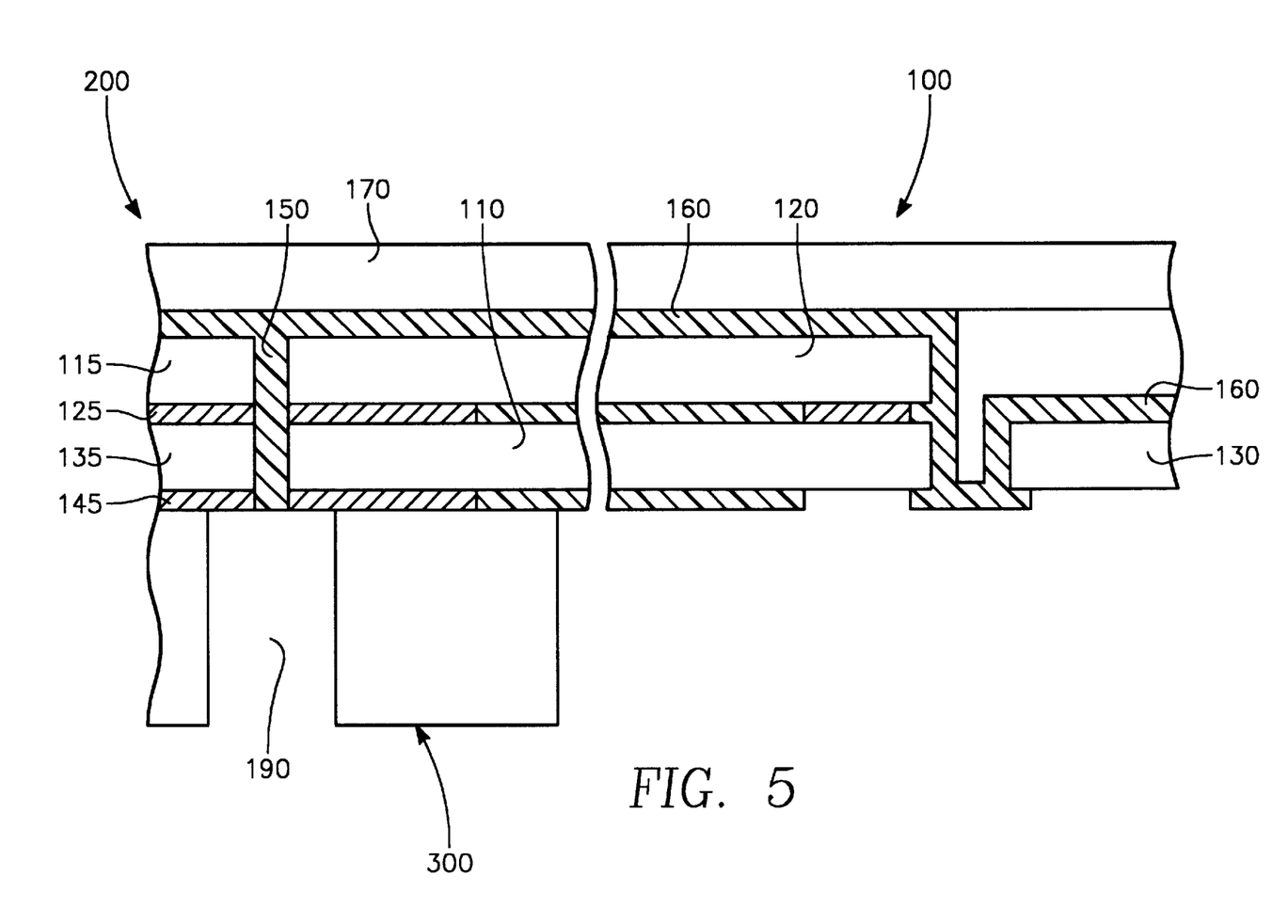
FIG. 5 shows a cut away side view of the workpiece of FIG. 4 after a back side etch of the workpiece in accordance with a possible implementation of the present invention.

The back side of the wafer 300 then is patterned with resist 180 placed on the back side of the wafer 300, as shown in FIG. 4. Next, as shown in FIG. 5, the wafer is etched to remove portions of the wafer 300 under movable structures of the MEMS device 100, such as structures 110, 120 and 130. A backside dicing trench 190 is formed along where the frontside dicing trench 150 is located. In this implementation, the backside dicing trench 190 is etched to join to the frontside trench 150 and the temporary holding material 160 within the frontside trench 150. Thus, after processing the trenches 150 and 190 completely separate the first MEMS device 100 and the second MEMS device 200, which are held together only by the temporary holding material 160 and the carrier wafer 170.

In this implementation, the backside dicing trench 190 is formed wider than the frontside dicing trench 150. This can reduce alignment and etching requirements.

Referring to FIG. 5, although not shown, it is possible to fabricate a device (not shown) such as a mirror, a light source, lens, sensors (magnetic, optical, acceleration, or the like), a probe microscopy element, an electron/particle beam steering element, an optical diffraction grating or other device during front side processing or from the back side of the wafer 300 during back side processing. In some implementations not shown in FIG. 5, it is possible to etch structures or portions of structures, such as 130, from the back side of the wafer 300 prior to separation of the MEMS devices.

Figure 6:
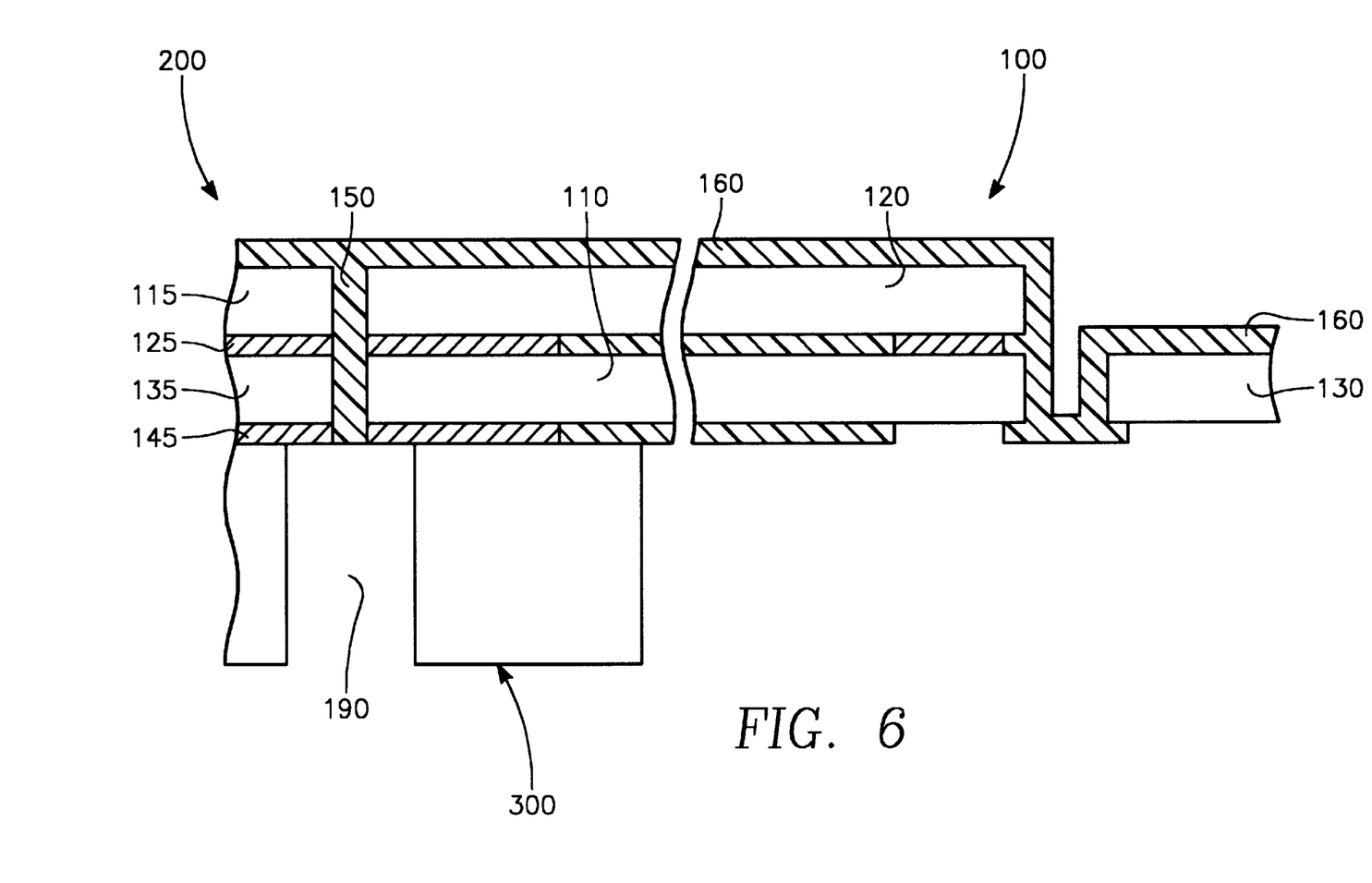
FIG. 6 shows a cut away side view of the workpiece of FIG. 5 after removal of the carrier wafer in accordance with a possible implementation of the present invention.
Figure 7:
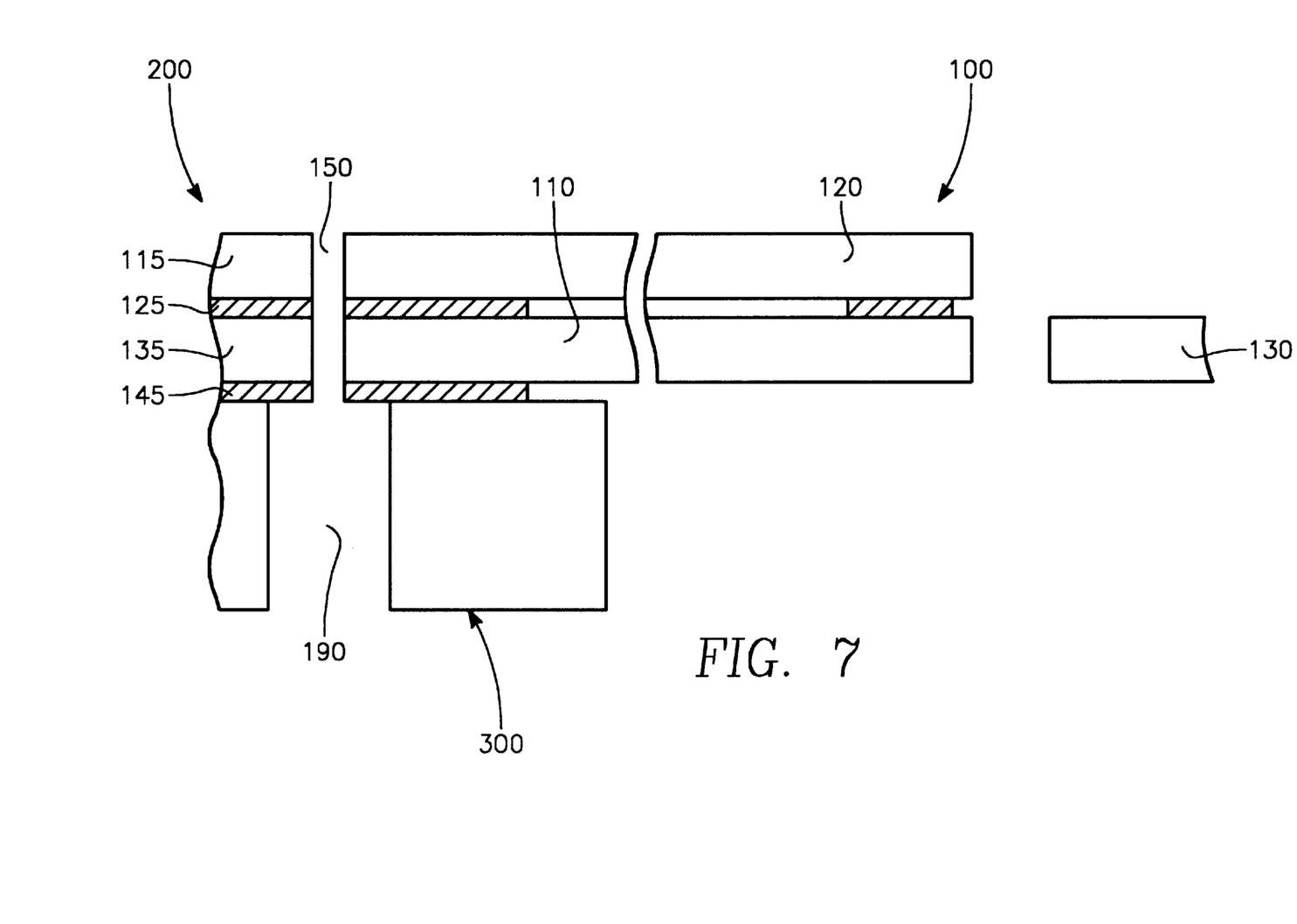
FIG. 7 shows a cut away side view of the workpiece of FIG. 6 after removal of the temporary holding material in accordance with a possible implementation of the present invention.

The carrier wafer 170 then is removed, as shown in FIG. 6. Next, as shown in FIG. 7 the temporary holding material 160 is then removed. In the case of parylene, an oxygen plasma asher, or other suitable apparatus may be used to remove the parylene. Dry removal of the temporary holding material 160 helps minimize damage to fragile structures, which could otherwise result from wet removal processes. Further, a dry removal process can limit contamination that otherwise might be associated with wet removal processes. In this implementation, removing the parylene self-dices MEMS devices without requiring sawing, scoring, cutting, grinding, or other similar separation techniques.

In other possible implementations not shown, the frontside dicing trench 150 need not extend all the way to the wafer 300 as shown in FIG. 1. For example, the frontside dicing trench 150 may extend only to layer 145. A portion of the layer 145 then may be removed during the etching of the backside trench 190 to join the frontside and backside trenches 150 and 190.

In one conceivable implementation, a portion of layer 145 (and/or additional layers) between the frontside dicing trench 150 and the backside dicing trench 190 may serve as a reduced force easy break-away type connection between the MEMS devices 100 and 200, or may be etched away with a front side or back side etch. Alternatively, in other possible implementations, the frontside dicing trench 150 may extend part way into the wafer 300, if desired.

In another possible implementation (not shown), for additional support of the chip, a backside carrier wafer (not shown) may be adhered to the back side of the wafer 300 after back side processing of the wafer 300. A dicing trench can then be etched through the back side of backside carrier wafer, either to create the backside dicing trench 190 in the wafer 300, or to join with the backside dicing trench 190 in the wafer 300.

In yet another possible implementation (not shown), the temporary holding material may be selectively removed, such as by masking, and/or it may be removed by several different etch processes, if desired. For example, it has been found by the present inventors that polymer holding materials such as parylene can sometimes crack if high thermal gradients occur in the holding material. This can sometimes occur during parylene removal if thermally isolated microstructures, such as suspended microstructures, are involved. Thus, in some implementations, multiple etch processes, or etch parameters, may be employed to inhibit thermal differentials from occurring during removal of polymer holding material.

Figure 8:
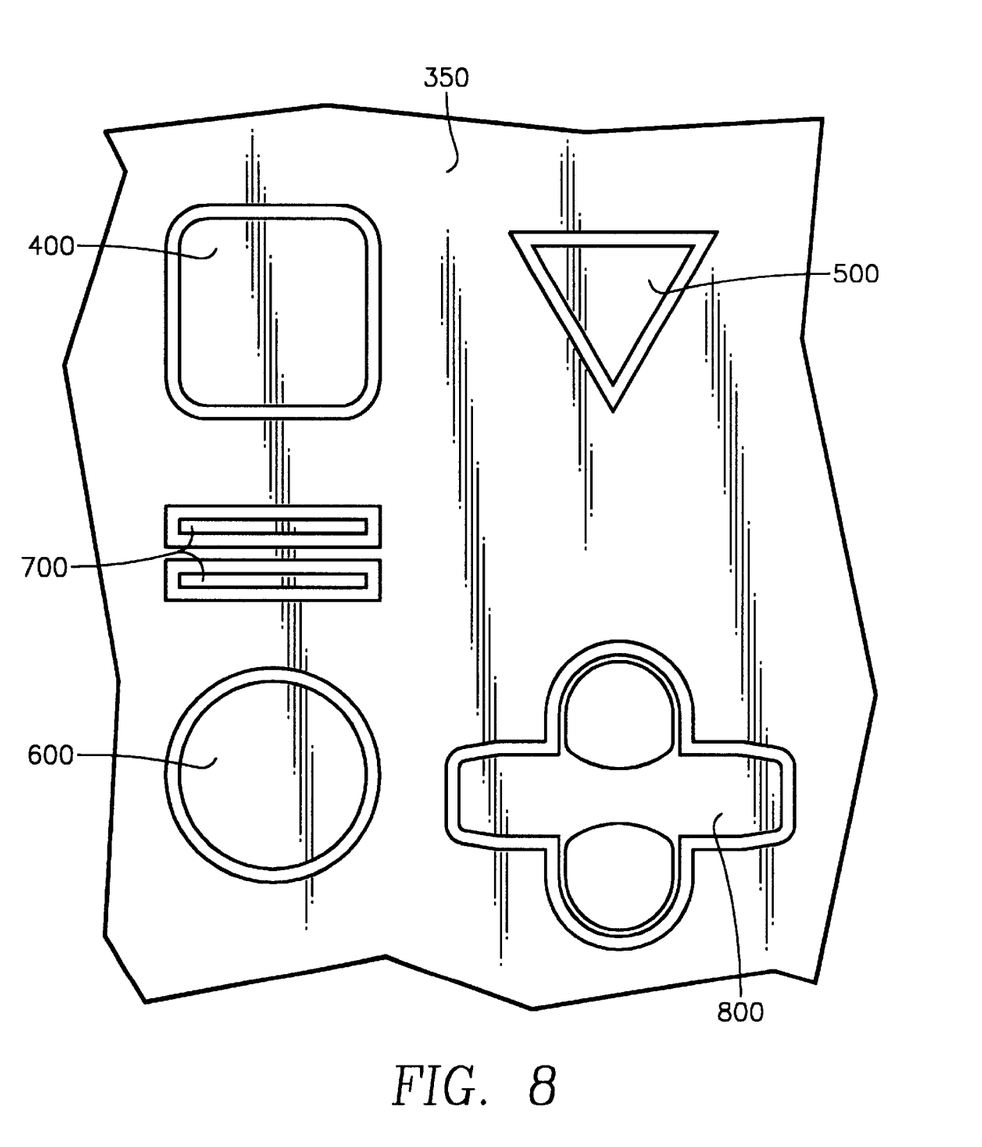
FIG. 8 shows a top view of a cut away section of a workpiece showing a few of many examples of possible chip shapes practicable with certain implementations of the present invention.

FIG. 8 shows a top view of a cut away section of a wafer 350 showing a few of many examples of possible chip shapes practicable with certain implementations of the present invention. Certain implementations of the present invention allow not only dicing of conventional orthogonal edged chip arrays (not shown), but they can also allow dicing or singulation of chips with non-orthoganal and/or non-linear edge portions. FIG. 8 shows simplified examples of a few of many possible chip shapes that may be diced. A few examples of the may possible chip shapes are rounded cornered 400, triangular 500, circular 600, elongated 700, and combination shapes 800. Other examples can include any combination of angled and curved edges. This can be utilized to reduce chip weight or chip size, or to facilitate mounting, among other utilizations.

Although described with reference to separation of two adjacent chips, it is understood that certain implementations of the present invention are well suited for singulation of chips in arrays of tens, to hundreds, to thousands, or more. Further, although in some instances the above is described with reference to processes involving MEMS fabrication, it is understood the certain implementations of the present invention have application to other thin film processes.

The foregoing description has been presented for the purposes of illustration and description. It is not intended to be exhaustive or to limit the invention to the precise form disclosed. Many modifications and variations are possible in light of the above teaching. It is intended that the scope of the invention be limited not by this detailed description of the invention, but rather by the claims appended hereto.

What is claimed is:

1. A method for chip singulation comprising:
   a) etching a frontside dicing trench from a front side of a wafer;
   b) forming a temporary holding material in the frontside dicing trench;
   c) etching a backside dicing trench from a back side of the wafer along the frontside dicing trench;
   d) removing the temporary holding material; and
   e) releasing the chip from at least one of the wafer or an adjacent chip.

2. The method of claim 1 wherein forming the temporary holding material comprises depositing by vapor phase deposition.

3. The method of claim 2 wherein removing the temporary holding material comprises dry etching.

4. The method of claim 3 wherein forming the temporary holding material comprises depositing a conformal material.

5. The method of claim 4 wherein forming the temporary holding material comprises depositing parylene.

6. The method of claim 5 wherein removing the conformal material comprises placing the wafer in an oxygen plasma.

7. The method of claim 1 wherein forming the temporary holding material in the frontside dicing trench further comprises forming the temporary holding material surrounding MEMS structures of a MEMS device.

8. The method of claim 7 wherein adding temporary holding material comprises adding parylene.

9. The method of claim 8 wherein removing the temporary holding material comprises placing the wafer in an oxygen plasma.

10. The method of claim 7 wherein etching the frontside dicing trench around the device comprises etching surface deposited layers on the front side of the wafer.

11. The method of claim 1 wherein etching the frontside dicing trench around the device comprises etching surface deposited layers on the front side of the wafer.

12. The method of claim 11 wherein etching the backside dicing trench comprises etching the backside dicing trench wider than the frontside dicing trench.

13. The method of claim 1 wherein etching the backside dicing trench comprises etching the backside dicing trench wider than the frontside dicing trench.

14. The method of claim 1 wherein forming the temporary holding material comprises depositing parylene.

15. The method of claim 14 wherein removing the conformal material comprises placing the wafer in an oxygen plasma.

16. The method of claim 1 wherein forming the temporary holding material in the frontside trench comprises filling the trench with the holding material, and further comprising surrounding MEMS structures of a MEMS device with the temporary holding material so as to secure the structures during etching of the back side of the wafer.

17. The method of claim 16 further comprising securing a temporary carrier wafer over the front side of the wafer.

18. The method of claim 1 further comprising securing a temporary carrier wafer over the front side of the wafer.

19. The method of claim 1 wherein etching the frontside dicing trench comprises etching the frontside dicing trench from a front side of a wafer while etching to define the structures of MEMS devices, and wherein etching the backside dicing trench comprises etching the backside dicing trench while etching a back side of the wafer to define the structures of the MEMS devices.

20. The method of claim 19 wherein forming the temporary holding material comprises depositing by vapor phase deposition.

21. The method of claim 20 wherein removing the temporary holding material comprises dry etching.

22. The method of claim 21 wherein forming the temporary holding material comprises depositing a conformal material.

23. The method of claim 22 wherein forming the temporary holding material comprises depositing parylene.

24. The method of claim 23 wherein removing the conformal material comprises placing the wafer in an oxygen plasma.

25. The method of claim 1 wherein removing the temporary holding material simultaneously releases an array of chips.

26. The method of claim 1 wherein etching the backside dicing trench comprises etching to the temporary holding material in the frontside dicing trench such that removing the temporary holding material self-dices the wafer.

27. The method of claim 1 wherein etching the frontside dicing trench comprises etching a non-linear portion, and wherein releasing the chip comprises separating a chip having non-linear edge from at least one of the wafer or an adjacent chip.

* * * * *